United States Patent [19]

Oohashi et al.

[11] Patent Number: 5,425,819
[45] Date of Patent: Jun. 20, 1995

[54] MAGNETORESISTIVE MATERIAL

[75] Inventors: Toshiyuki Oohashi; Naoshi Horiai; Makoto Shiraki, all of Hamamatsu, Japan

[73] Assignee: Yamaha Corporation, Shizuoka, Japan

[21] Appl. No.: 297,222

[22] Filed: Aug. 29, 1994

[30] Foreign Application Priority Data

Aug. 31, 1993 [JP] Japan .................. 5-216340

[51] Int. Cl.$^6$ .............................. H01F 1/147
[52] U.S. Cl. ................... 148/300; 148/315; 420/501; 420/502
[58] Field of Search ............. 148/300, 315; 420/501, 420/502

[56] References Cited

U.S. PATENT DOCUMENTS

| | | | |
|---|---|---|---|
| 4,809,109 | 2/1989 | Howard et al. | 360/113 |
| 4,879,619 | 11/1989 | Fontana, Jr. et al. | 360/113 |
| 5,014,147 | 5/1991 | Parkin et al. | 360/113 |
| 5,262,914 | 11/1993 | Chen et al. | 360/113 |

FOREIGN PATENT DOCUMENTS

| | | |
|---|---|---|
| 0590434 | 9/1993 | European Pat. Off. . |
| 6-101000 | 4/1994 | Japan . |

OTHER PUBLICATIONS

S. Zhang, "Theory of giant magnetoresistance in magnetic granular films", Appl. Phys. Lett., 61 (15) Oct. 12, 1992, pp. 1855–1857.

A. Tsoukatos, et al., "Giant magnetoresistance in magnetically inhomogeneous thin films", Appl. Phys. Lett. 61 (25) Dec. 21, 1992, pp. 3059–3061.

A. E. Berkowitz, "Giant magnetoresistance in heterogeneous Cu-Co and Ag-Co alloy films (invited)", J. Appl. Phys. 73 (10) May 15, 1993, pp. 5320–5325.

A. Maeda, et al., "Giant magnetoresistance effect in grain-type alloy thin films", J. Phys.,: Condens. Matter 5 (1993) L189–L194.

A. Maeda, et al., "Annealing effects on the magnetoresistance characteristics of grain-type alloy thin films", J. Phys.,: Condens. Matter 5, (1993) 4641–4646.

A. E. Berkowitz, et al., "Giant Magnetoresistance in Heterogeneous Cu-Co Alloys", Physical Review Letters, vol. 68, No. 25, Jun. 22, 1992, pp. 3745–3748.

Tsoukatos, et al., "Giant magnetoresistance studies in (Fe, Co)-Ag films", Thirty-Seventh Annual Conference on Magnetism and Magnetic Materials, Journal of Applied Physics, May 15, 1993.

Chien, et al, "Giant negative magnetoresistance in granular ferromagnetic systems", Thirty-Seventh Annual Conference on Magnetism and Magnetic Materials, Journal of Applied Physics, May 15, 1993.

B. Dieny et al., "Giant Magnetoresistance in sputtered and melt-spun alloys", Journal of Magnetism and Magnetic Materials, 126 (1993), pp. 433–436.

Primary Examiner—John P. Sheehan
Attorney, Agent, or Firm—Ostrolenk, Faber, Gerb & Soffen

[57] ABSTRACT

A granule-type magnetoresistive material is used to form a MR component, which is equipped in a magnetic head, or the like. When placing the magnetoresistive material in the external magnetic field, the electric resistance is altered responsive to a variation of the external magnetic field. In order to increase a magnetic-field sensitivity, the magnetoresistive material is composed of an alloy whose atomic composition is expressed by a chemical formula of $(Co_{1-x}Fe_x)_y Ag_{1-y}$, where $0.45 \leq x \leq 0.55$ and $0.24 \leq y \leq 0.35$; or another chemical formula of $(Co_{1-x}Fe_x)_y (Ag_{1-z}Cu_z)_{1-y}$, where $0.45 \leq x \leq 0.55$, $0.24 \leq y \leq 0.35$ and $z \leq 0.14$.

4 Claims, 7 Drawing Sheets

DIRECTION OF MAGNETIC ANISOTROPY;
DIRECTION OF ELECTRIC CURRENTS

MAGNETORESISTIVE MATERIAL

BACKGROUND OF THE INVENTION

1. Field of the Invention

The present invention relates to a magnetoresistive material whose electric resistance is altered responsive to a variation of a magnetic field externally produced.

2. Prior Art

Conventionally, there are provided magnetoresistive materials whose electric resistance is altered responsive to the variation of the magnetic field externally produced. Such effect of the magnetoresistive materials is called "magnetoresistive effect" (or simply called as "MR effect"). The above-mentioned magnetoresistive materials are widely used, in the magnetic recording-/reproducing apparatuses, for the magnetic heads, sensors which sense the magnetic field, and the like. The known alloyed-magnetoresistive materials such as the Ni—Fe alloy (i.e., Permalloy) are used as the magnetoresistive materials. In addition, the granular-type magnetoresistive materials, which have fine magnetic granules embedded in the conductive non-magnetic metals, are also known. According to the known granular-type magnetoresistive materials, cobalt (Co) is embedded in copper (Cu); cobalt (Co) is embedded in silver (Ag); or Fe—Co alloy is embedded in silver (Ag), for example.

However, the known magnetoresistive materials described above suffer from the following drawbacks.

In the alloyed-magnetoresistive materials such as the Permalloy, the saturation magnetization is relatively large. Thus, when being applied to the magnetic head or sensor, the width of the magnetoresistive member (i.e., width of the magnetoresistive wire) should be reduced in order to improve the resolution. In that case, the effect of the demagnetizing field becomes large, which results in the reduction of the sensitivity for the detection of the magnetic filed. This phenomenon can be explained in detail by referring to FIGS. 7A and 7B. In those drawings, there is provided a magnetoresistive member 10 to which the magnetic anisotropy is imparted in its longitudinal direction. Under the condition where electric currents are applied to the magnetoresistive member 10 along longitudinal direction, an external magnetic field 'Hex', which is crossing the magnetoresistive member 10 in a direction perpendicular to the longitudinal direction, can be detected. In this case, as shown in FIG. 7B, magnetization M, which is caused due to the external magnetic field Hex in the magnetoresistive member 10, acts as demagnetizing field Hd which is produced in a direction inverse to the direction of the external magnetic field Hex. Thus, the external magnetic field Hex is weakened by the demagnetizing field Hd. As a result, the sensitivity of the magnetoresistive member 10 for the detection of the magnetic field is reduced. On the other hand, the granular-type magnetoresistive materials are advantageous in that the saturation magnetization is relatively small. In other words, the granular-type magnetoresistive materials are hardly affected by the demagnetizing field. Thus, even if a width of a strip of the magnetoresistive member is narrowed, the sensitivity may not be substantially reduced. Actually, however, the granular-type magnetoresistive materials is not suitable for the practical usage, because the absolute sensitivity for the detection of the magnetic field is low.

SUMMARY OF THE INVENTION

It is an object of the present invention to provide a granular-type magnetoresistive material which has a high sensitivity for the detection of the magnetic field and whose electric resistance is sharply altered responsive to a small variation of the magnetic field.

In order to achieve the above-mentioned object, the magnetoresistive material according to the present invention is composed of an alloy having an atomic composition of $(Co_{1-x}Fe_x)_y Ag_{1-y}$, where $0.45 \leq x \leq 0.55$ and $0.24 \leq y \leq 0.35$. Herein, the copper (Cu) can be held in solid solution in the base phase of Ag up to the solubility limit of Cu into Ag (i.e., 14 atomic-percentage).

BRIEF DESCRIPTION OF THE DRAWINGS

Further objects and advantages of the present invention will be apparent from the following description, reference being had to the accompanying drawings wherein the preferred embodiment of the present invention is clearly shown.

In the drawings.

DESCRIPTION OF THE PREFERRED EMBODIMENT

[A] Fundamental concept

Figure 8:
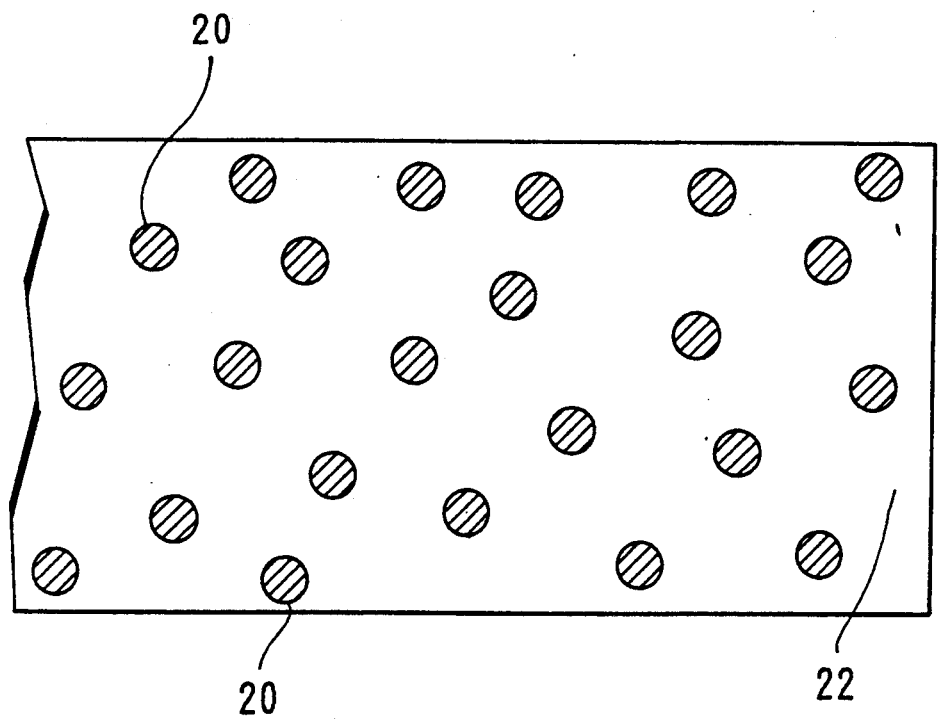
FIG. 8 is a drawing illustrating a structure of a granular-type magnetoresistive material.

The present invention relates to a magnetoresistive material, especially to a granular-structure-type magnetoresistive material. In the present invention, the granular-type magnetoresistive material shall be defined as the material in which magnetic materials 20, made by Co—Fe alloy, are uniformly dispersed in a bulk of a conductive and non-magnetic material 22, made by Ag or Ag—Cu alloy (see FIG. 8). The granular structure shows magnetic isotropy in a main surface as described below.

The inventors of this patent application have made several kinds of experiments and studies to search for the magnetoresistive material which has a high sensitivity for the detection of the magnetic field. Incidentally, this sensitivity will be referred to as magnetic-field sensitivity. Through the experiments and studies, we have reached a conclusion in which the magnetic-field sensitivity of the magnetoresistive material can be increased by limiting the range of the atomic composition of the alloy (which is made by a set of atomic elements Co, Fe and Ag or another set of atomic elements Co, Fe, Ag and Cu). In fact, the present invention is made based on the results of the experiments.

Fundamentally, the magnetoresistive material according to the present invention is composed of the alloy having an atomic composition, which is expressed by a following chemical formula.

$$(Co_{1-x}Fe_x)_y Ag_{1-y} \quad (1)$$

where $0.45 \leq x \leq 0.55$ and $0.24 \leq y \leq 0.35$.

In the above chemical formula (1), if the value of "y" is less than 0.24 (i.e., y<0.24), or if the value of "y" is greater than 0.35 (i.e., y>0.35), the magnetic-field sensitivity (dMR/dH) is less than 0.05 (%/Oe). In the present invention, the magnetic-field sensitivity is defined as the change of resistance in the percentage per unit magnetic field Oe (in Oersted). Further, even if the value of "x" is less than 0.45 (i.e., x<0.45), or even if the value of "x" is greater than 0.55 (i.e., x>0.55), it is difficult to increase the value of the magnetic-field sensitivity to be greater than 0.05 (%/Oe). In order to utilize the magnetoresistive material for the sensor using the MR effect, the magnetic-field sensitivity of the magnetoresistive material should be equal to or greater than 0.05 (%/Oe). For this reason, the value of "x" used in the chemical formula (1) is limited to the range of "$0.45 \leq x \leq 0.55$", while the value of "y" is limited to the range of "$0.24 \leq y \leq 0.35$".

The copper (Cu) may also be included up to the solubility limit of Cu into the base phase of Ag (i.e., 14 atomic-percentage), the magnetoresistive material, as expressed by the aforementioned chemical formula (1), may not be substantially changed in magnetic-field sensitivity. Therefore, another atomic composition, as expressed by a chemical formula (2), can be employed for the alloy realizing the magnetoresistive material. The alloy as expressed by the chemical formula (2) can offer a good magnetic-field sensitivity as well, which is similar to that of the alloy as expressed by the aforementioned chemical formula (1).

$$(Co_{1-x}Fe_x)_y(Ag_{1-z}Cu_z)_{1-y} \quad (2)$$

where $0.45 \leq x \leq 0.55$, $0.24 \leq y \leq 0.35$ and $z \leq 0.14$.

[B] Samples

Next, samples of the magnetoresistive materials, which are made in accordance with the present invention, will be described.

A parallel-plate-electrode-type RF sputtering apparatus is employed to effect a sputtering process on a composite target which is made by mounting Fe—Co alloy chips on a target composed of Ag or Ag—Cu alloy material. Through the sputtering process, a magnetoresistive film is deposited on a glass substrate. This magnetoresistive film has a width of 1 mm, a length of 20 mm and a thickness of 1000 Å, for example. Although Co—Fe alloy is immiscible into silver (AK) in a heat-equilibrium state, the Co—Fe alloy forms metastable alloy with Ag through sputtering deposition as if the Co—Fe alloy forcibly dissolves into Ag. By changing the composition of the target and Fe—Co alloy, it is possible to form a plurality of samples of magnetoresistive film, wherein each sample has different atomic compositions. Those samples of magnetoresistive film are formed under the certain condition where the plasma ambient gas is Ar gas, the pressure is at 0.4 Pa, the RF power of the apparatus is 300 W and the deposition-time is five minutes. A metal mask, which is made of stainless steel (i.e., SUS) and which has an aperture having a size of 20 mm × 1 mm, is employed as a deposition mask. In manufacturing the samples of the preferred embodiment, materials having high purity of 99.99% are used for Ag, Cu, Fe and Co. These high purity materials include inevitable impurities, such as aluminum (Al), manganese (Mn), nickel (Ni), silicon (Si), etc., therein up to a total amount of 0.1%. The inevitable impurities included in the high purity materials are conveyed to magnetoresistive material samples. Through the sputtering process, argon (Ar) which is an ambient gas will be included with several percent in the magnetoresistive material of the preferred embodiment. Additionally, other gas materials such as oxygen might be included in argon gas source and will also be included in the magnetoresistive material.

The above-mentioned samples are annealed; first, the samples are put into a furnace; and then, the temperature thereof is increased at a rate of 25° C./min in the Ar gas flowing at a rate of 2 lit./min.; thereafter, the temperature is maintained at 270° C. for one hour; and finally, the samples put in the furnace are cooled down to the room temperature.

As mentioned above, the Co—Fe alloy forms the metastable alloy with Ag through the sputtering process. The annealing process converts the metastable alloy into a separated structure (i.e., granular structure) of Co—Fe alloy and Ag. The granular structure of Co—Fe alloy and Ag consists of Co—Fe alloy particles uniformly dispersed in a bulk of Ag which is non-magnetic material per se. As the Co—Fe alloy is immiscible to Ag, the granular structure of Co—Fe alloy and Ag has clear interfaces between the Co—Fe alloy particles and Ag bulk. The interfaces of Co—Fe alloy particles and Ag cause the scattering of electrons. The uniformly dispersed Co—Fe alloy particles in the granular structure show magnetic isotropy in a main plane thereof with respect to an applied magnetic field although a demagnetizing field may still arise.

Figure 3:
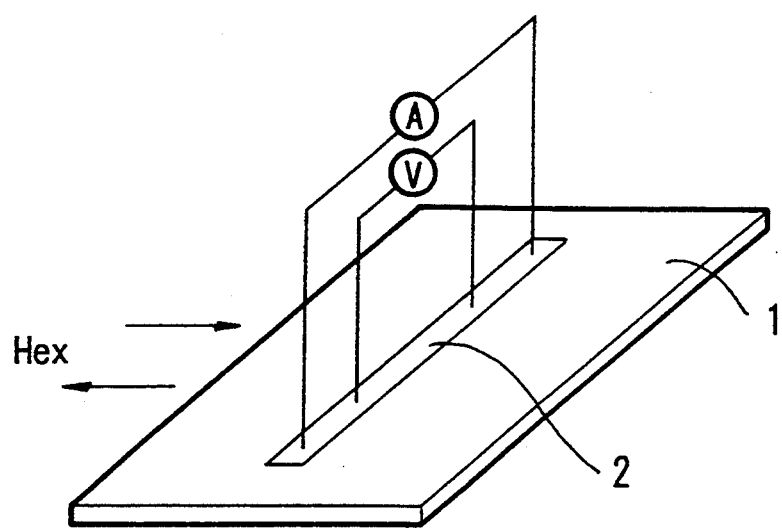
FIG. 3 is a perspective view illustrating a four-terminal method which is used to measure the magnetic-field sensitivity.

Thereafter, the magnetic-field sensitivity is measured by the four-terminal method as shown by FIG. 3. Herein, a distance between electrodes of a current source "A" is set at 19 mm, while a distance between electrodes of a voltage-measuring device "V" is set at 11 mm. Electric currents at a current density of 100 A/mm² are flown through a magnetoresistive film 2 which is deposited on a glass substrate 1, while the external magnetic field Hex is altered within a range between −5 kOe and 5 kOe. In this case, a velocity of altering the external magnetic field Hex is approximately set at 5 kOe/min. Herein, the voltage across the electrodes of the voltage-measuring device is varied in response to the external magnetic field Hex, so that the variation of voltage is measured by the voltage-measuring device V in connection with the variation of the external magnetic field Hex. The measured variation of voltage is converted into a variation rate of resistance regarding the variation of the external magnetic field. Incidentally, a direction of the external magnetic field Hex is placed perpendicular to the direction of the electric currents flowing through the sample and is also placed parallel to the surface of the sample. The intensity of the external magnetic field Hex is measured by the Gauss meter.

Figure 1:
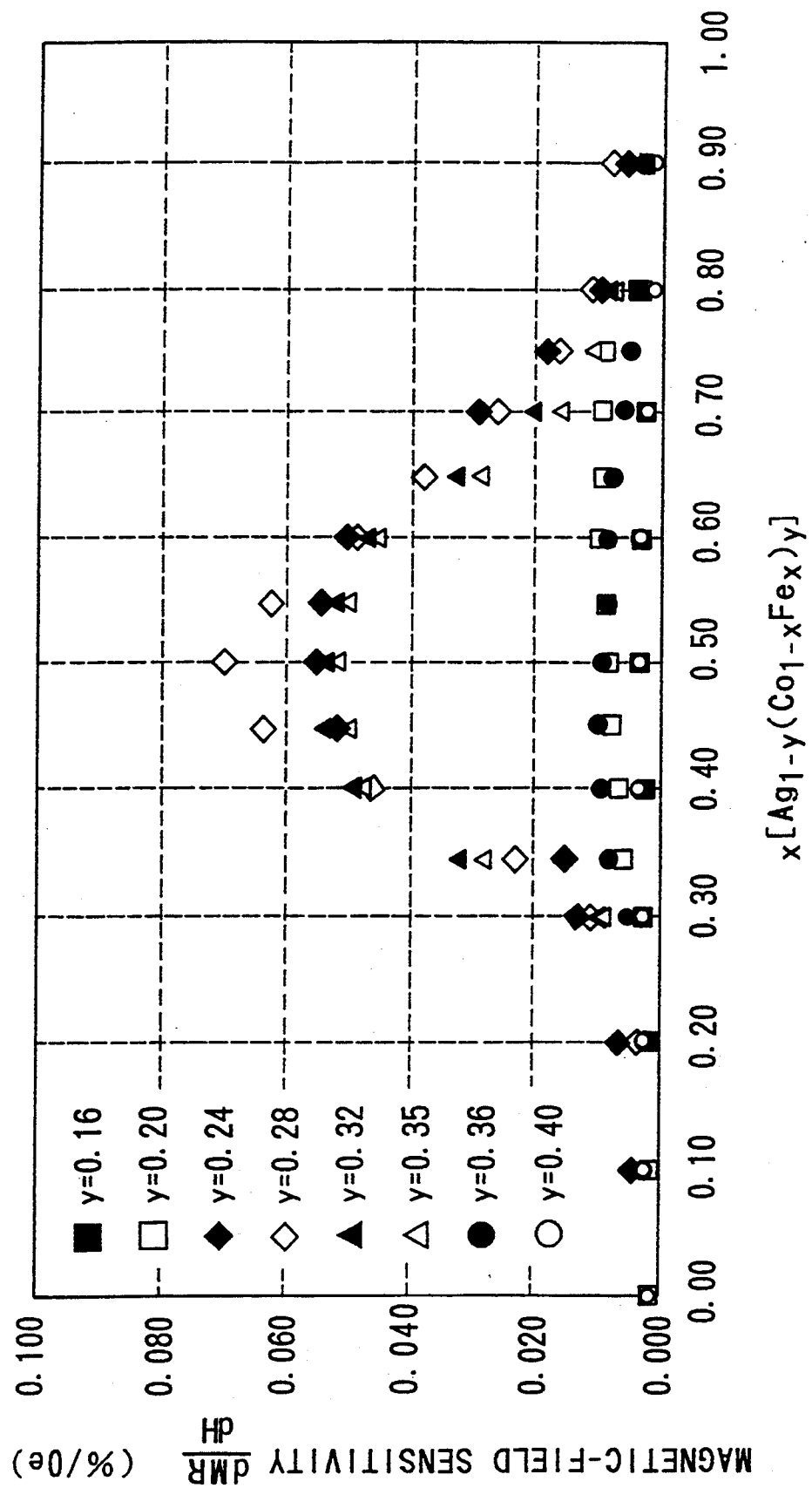
FIG. 1 is a graph showing a relationship between the magnetic-field sensitivity and each of the atomic compositions of the alloy of $(Co_{1-x}Fe_x)_y Ag_{1-y}$ with respect to the atomic component of Co, Fe and Ag.
Figure 2:
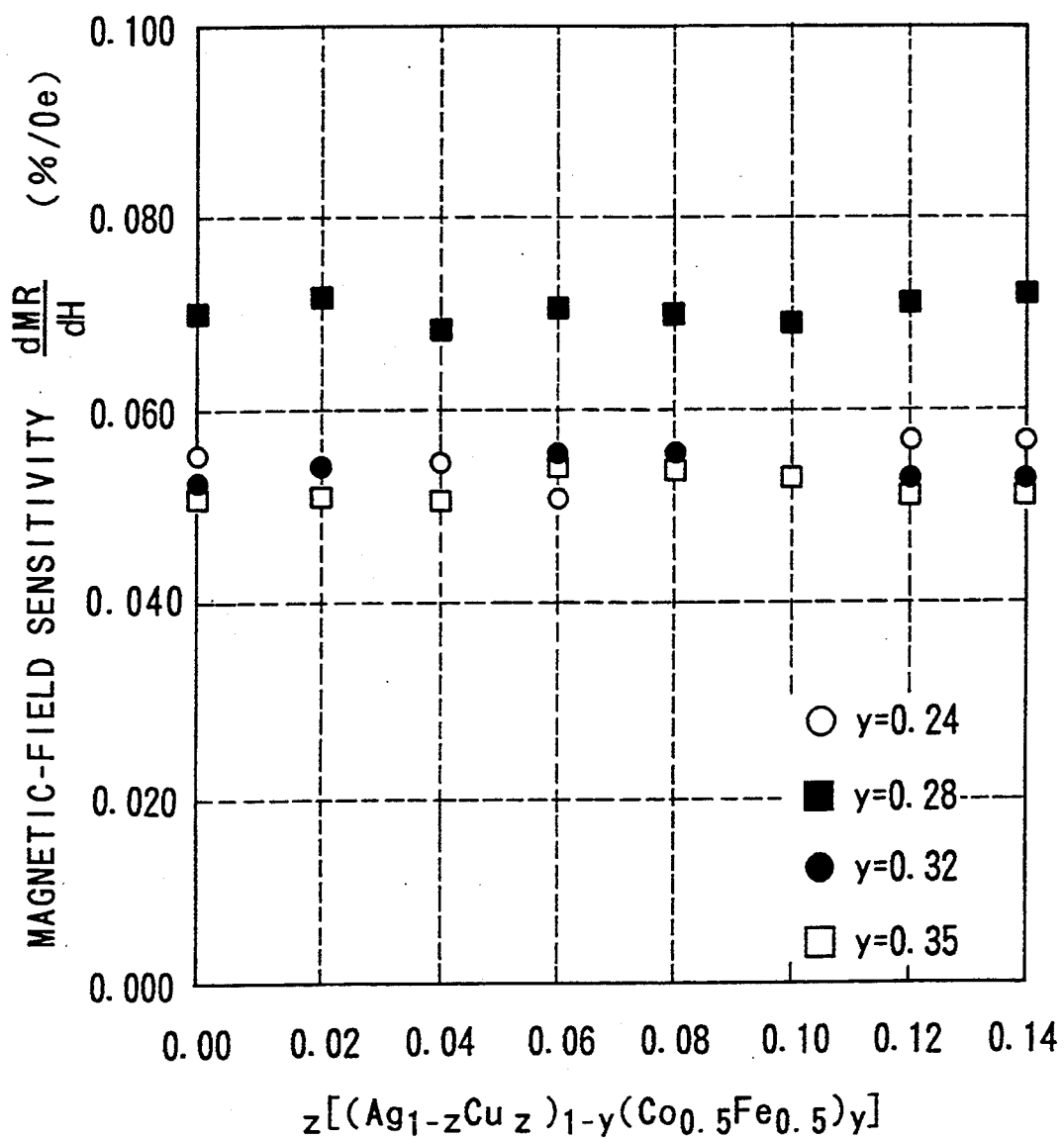
FIG. 2 is a graph showing a relationship between the magnetic-field sensitivity and each of the atomic compositions of the alloy of $(Co_{0.5}Fe_{0.5})_y(Ag_{1-z}Cu_z)_{1-y}$.

Relationship between the magnetic field and the atomic composition of the magnetoresistive film is shown by FIGS. 1 and 2 together with Tables 1 and 2. A pair of FIG. 1 and Table 1 are used to indicate the relationship between the magnetic field and the atomic composition of the magnetoresistive film which is made by the alloy of $(Co_{1-x}Fe_x)_y Ag_{1-y}$, while a pair of FIG. 2 and Table 2 are used to indicate the relationship between the magnetic field and the atomic composition of the magnetoresistive film which is made by the alloy of $(Co_{0.5}Fe_{0.5})_y(Ag_{1-z}Cu_z)_{1-y}$. In addition, the unit of "%/Oe" is used for the numbers, representing the magnetic-field sensitivity, described in Tables 1 and 2.

TABLE 1

| value of x | value of y | | | | | | | |
|---|---|---|---|---|---|---|---|---|
| | 0.16 | 0.20 | 0.24 | 0.28 | 0.32 | 0.35 | 0.36 | 0.40 |
| 0.00 | 0.001 | 0.001 | 0.001 | 0.002 | 0.002 | 0.001 | 0.001 | 0.001 |
| 0.10 | 0.001 | 0.001 | 0.003 | 0.003 | 0.003 | 0.002 | 0.002 | 0.002 |
| 0.20 | 0.001 | 0.002 | 0.005 | 0.004 | 0.004 | 0.003 | 0.003 | 0.002 |
| 0.30 | 0.002 | 0.004 | 0.008 | 0.009 | 0.009 | 0.008 | 0.005 | 0.003 |
| 0.35 | — | 0.005 | 0.015 | 0.022 | 0.032 | 0.028 | 0.007 | — |
| 0.40 | 0.002 | 0.006 | 0.046 | 0.049 | 0.049 | 0.047 | 0.009 | 0.003 |
| 0.45 | — | 0.007 | 0.053 | 0.063 | 0.054 | 0.051 | 0.009 | — |
| 0.50 | 0.003 | 0.008 | 0.055 | 0.070 | 0.053 | 0.052 | 0.009 | 0.003 |
| 0.55 | — | 0.008 | 0.054 | 0.062 | 0.052 | 0.051 | 0.008 | — |
| 0.60 | 0.003 | 0.009 | 0.049 | 0.049 | 0.047 | 0.046 | 0.008 | 0.003 |
| 0.65 | — | 0.009 | 0.039 | 0.038 | 0.033 | 0.029 | 0.007 | — |
| 0.70 | 0.003 | 0.009 | 0.028 | 0.026 | 0.020 | 0.016 | 0.006 | 0.002 |
| 0.75 | — | 0.008 | 0.019 | 0.017 | 0.012 | 0.011 | 0.005 | — |
| 0.80 | 0.003 | 0.004 | 0.009 | 0.009 | 0.008 | 0.008 | 0.004 | 0.002 |
| 0.90 | 0.002 | 0.002 | 0.004 | 0.005 | 0.003 | 0.002 | 0.002 | 0.001 |

TABLE 2

| value of z | value of y | | | |
|---|---|---|---|---|
| | 0.24 | 0.28 | 0.32 | 0.35 |
| 0.00 | 0.055 | 0.070 | 0.053 | 0.052 |
| 0.02 | 0.054 | 0.071 | 0.054 | 0.051 |
| 0.04 | 0.054 | 0.068 | 0.050 | 0.050 |
| 0.06 | 0.051 | 0.070 | 0.054 | 0.053 |
| 0.08 | 0.054 | 0.069 | 0.055 | 0.053 |
| 0.10 | 0.052 | 0.068 | 0.052 | 0.052 |
| 0.12 | 0.056 | 0.070 | 0.052 | 0.051 |
| 0.14 | 0.056 | 0.071 | 0.052 | 0.051 |

FIG. 1 and Table 1 obviously show that in the case of the alloy of $(Co_{1-x}Fe_x)_y Ag_{1-y}$, the magnetic-field sensitivity can be certainly increased to 0.05 (/Oe) or more by limiting the value of "x" within a range of "$0.455 \leq x \leq 0.55$" and also limiting the value of "y" within a range of "$0.24 \leq y \leq 0.35$". The reasons why the above optimum range is set for the ratio of Co—Fe alloy and Ag (y) will be described below.

The electrons flowing through the magnetoresistive material of $(Co_{1-x}Fe_x)_y Ag_{1-y}$ are scattered at the interfaces of Co—Fe alloy particles and Ag bulk. As an amount of Co—Fe component increases, the scattering probability also increases. However, the Co—Fe particles tend to coalesce and further agglomerate each other as the amount of Co—Fe component increases more. Hence, the surface area decreases in turn when the amount of Co—Fe component exceeds a predetermined amount. Such decrease of the surface area lessens an effect on the electrons flowing through the magnetoresistive material. As a result, the magnetoresistivity also decreases, which leads to a decrease in the sensitivity of the magnetoresistive material. Therefore, the optimum range can be set for the ratio of Co—Fe alloy and Ag (y).

The Co—Fe alloy shows miscibility in the copper (Cu) bulk. The miscibility makes the interfaces between the Co—Fe alloy particles and Cu bulk ambiguous. Such ambiguity at the interfaces causes a decrease in the ratio of the scattering of the electrons flowing therethrough at the interfaces, so that the sensitivity of the magnetoresistive material will be eventually decreased. However, according to FIG. 2 and Table 2, even if Ag, forming the base phase, is partially replaced by Cu of 14 atomic-percentage or less, the magnetic-field sensitivity is not substantially changed, in other words, a good magnetic-field sensitivity can be maintained. In the granular structure of Co—Fe alloy and Ag—Cu alloy consisting of Cu of 14 atomic-percentage or less, the same phenomenon described above is occurred.

Figure 5:
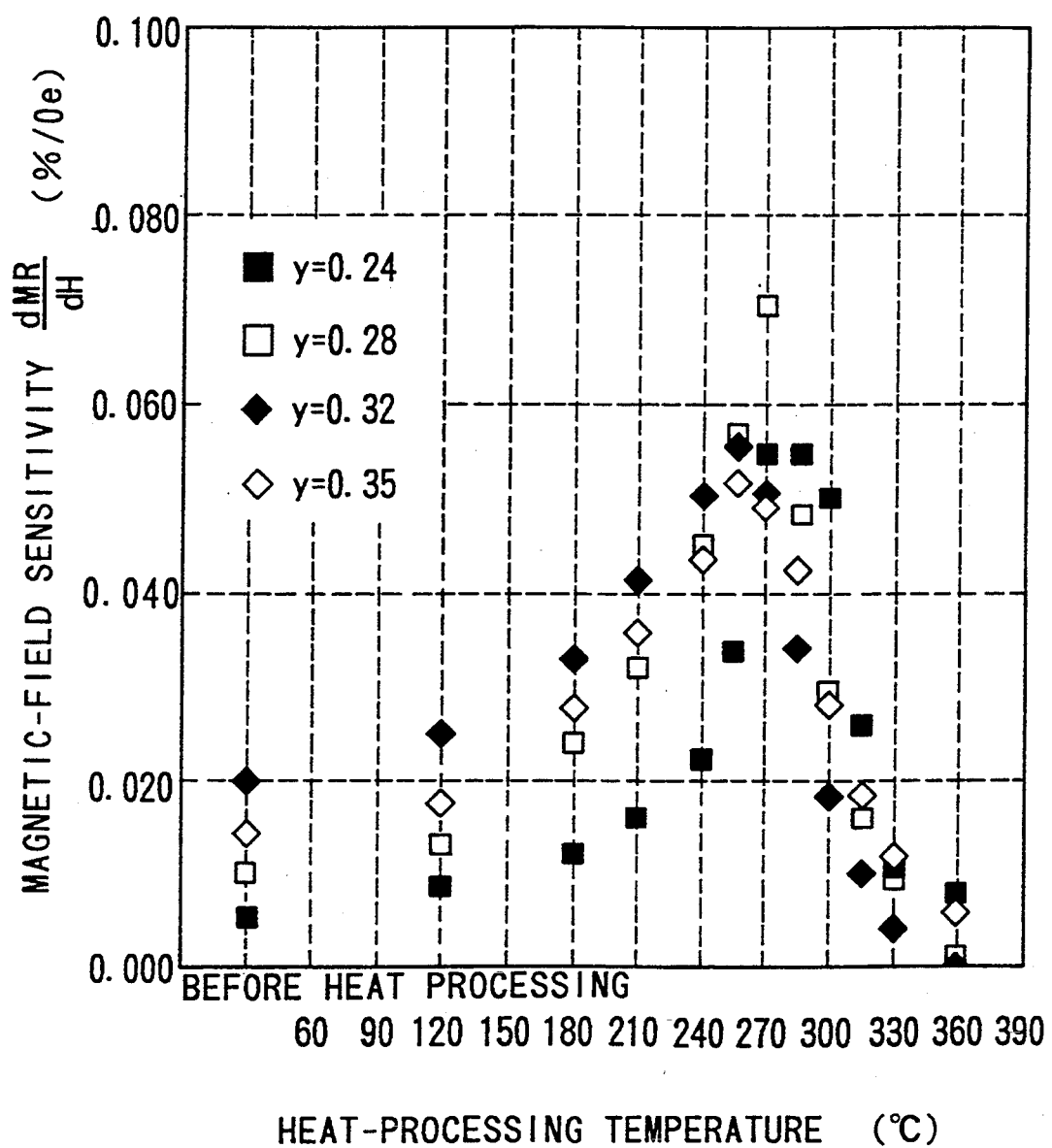
FIG. 5 is a graph showing a relationship between the magnetic-field sensitivity and heat-processing temperature with respect to the alloy of $(Co_{0.5}Fe_{0.5})_y Ag_{1-y}$.

Next, we have made studies on the relationship between the magnetic-field sensitivity and the heat-processing temperature of the magnetoresistive film. Herein, after the magnetoresistive film is deposited, a certain heat processing is effected at a certain heat-processing temperature. Now, the magnetoresistive film is deposited on the glass substrate as described before; and then, the heat processing is effected on the magnetoresistive film at the temperature ranging from 120° C. to 360° C. In this case, the alloy of $(Co_{0.5}Fe_{0.5})_y Ag_{1-y}$ is used to form an example of the magnetoresistive film, whereas the value of "y" is set at 0.24, 0.28, 0.32 or 0.35. By using the aforementioned four-terminal method as shown by FIG. 3, the magnetic-field sensitivity of this example is detected. Results of the detection are shown by FIG. 5 and Table 3. Incidentally, the unit of "%/Oe" is used for the numbers, representing the magnetic-field sensitivity, described in Table 3.

TABLE 3

| temperature °C. | value of y | | | |
|---|---|---|---|---|
| | 0.24 | 0.28 | 0.32 | 0.35 |
| no annealing | 0.005 | 0.010 | 0.020 | 0.014 |
| 120 | 0.008 | 0.013 | 0.025 | 0.018 |
| 180 | 0.012 | 0.024 | 0.033 | 0.026 |
| 210 | 0.016 | 0.032 | 0.041 | 0.034 |
| 240 | 0.022 | 0.045 | 0.050 | 0.044 |
| 255 | 0.034 | 0.057 | 0.056 | 0.053 |
| 270 | 0.055 | 0.070 | 0.053 | 0.052 |
| 285 | 0.054 | 0.048 | 0.034 | 0.041 |
| 300 | 0.050 | 0.030 | 0.018 | 0.029 |
| 315 | 0.026 | 0.017 | 0.010 | 0.019 |
| 330 | 0.010 | 0.009 | 0.004 | 0.011 |
| 360 | 0.005 | 0.001 | 0.001 | 0.004 |

TABLE 4

| | width of element wire (μm) | | | | | |
|---|---|---|---|---|---|---|
| | 5 | 10 | 20 | 30 | 40 | 50 |
| NiFe | 0.04 | 0.06 | 0.09 | 0.14 | 0.16 | 0.18 |
| Ag(CoFe) | 0.06 | 0.07 | 0.07 | 0.07 | 0.07 | 0.07 |

In the meantime, an optimum range of temperature may be slightly differed with respect to each of the atomic compositions of the magnetoresistive film. However, FIG. 5 and Table 3 show that the magnetoresistive material, on which the heat processing using the temperature ranging from 120° C. to 330° C. is effected, is improved in the magnetic-field sensitivity as compared to the magnetoresistive material on which the heat processing is not effected. The reasons why the peaks appear in the sensitivity of the magnetoresistive material will be described below.

As mentioned above, the Co—Fe alloy forms the metastable alloy with Ag through the sputtering deposition, although the Co—Fe alloy is immiscible into silver (Ag) in a heat-equilibrium state. However, the annealing process converts the metastable alloy into a granular structure of Co—Fe alloy and Ag. The annealing temperature effects on a size of the Co—Fe alloy particles; namely, as the annealing temperature increases, the size of the Co—Fe alloy particles is assumed to be increased. As mentioned previously, the sensitivity of the granular-type magnetoresistive material will increase as the size of the Co—Fe alloy particles increases, while agglomeration will occur as the size of the Co—Fe alloy increases further; and the agglomeration will cause a decrease in the sensitivity of the magnetoresistive material. In the annealing process, the size of the Co—Fe alloy particles is assumed to be larger as the annealing temperature is increased. The physical phenomenon, explained before, will be suited for the enlargement in the size of the Co—Fe alloy particles during the annealing process. In other words, the agglomeration is assumed to be occurred as the annealing temperature increases, so that the total surface area of the Co—Fe alloy particles will be eventually decreased. As a result, the sensitivity of the magnetoresistive material will decrease as the annealing temperature increases. Therefore, peaks are appeared in the sensitivity of the magnetoresistive material. The above-mentioned explanation will be suited for the granular-type magnetoresistive material consisting of the Fe—Co alloy and Ag partially replaced by Cu of 14 atomic-percentage or less.

Figure 4:
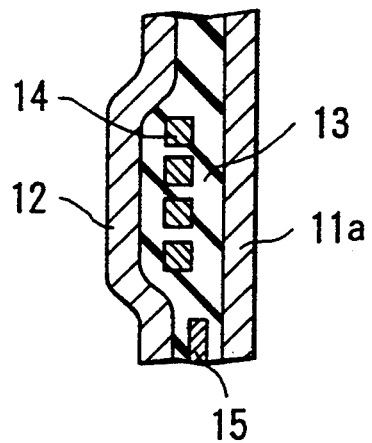
FIGS. 4A and 4B are sectional views each illustrating a construction of a magnetic head.
Figure 4:
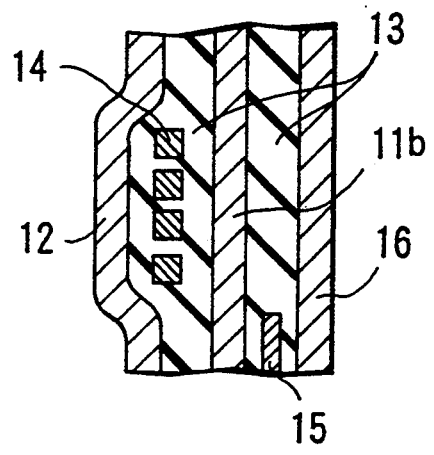

Next, examples of the construction of the magnetic head, in which the magnetoresistive material according to the present invention is equipped as the MR component for a reading head element, will be described by referring to FIGS. 4A and 4B. FIG. 4A is a sectional view simply illustrating the construction of the so-called in-gap-type magnetic head in which the MR component is equipped inside the gap layer for a recording head element, while FIG. 4B is a sectional view simply illustrating the construction of the so-called piggy-back-type magnetic head in which the MR component, whose both sides are sealed, is equipped outside the gap layer for a recording head element. In each of the magnetic heads, coils 14, for the recording head element, are buried in an insulation layer 13. In the in-gap-type magnetic head shown in FIG. 4A, the insulation layer 13 is sandwiched between a lower core 11$a$ and an upper core 12. In addition, an MR component 15 is arranged in the insulation layer 13 at a position between a tip-edge portion (called as a leading pole) of the lower core 11$a$ and a tip-edge portion (called as a trailing pole) of the upper core 12. In the piggy-back-type magnetic head shown in FIG. 4B, the insulation layer 13 is sandwiched between the upper core 12 and a lower core 11$b$. In addition, the MR component 15 is arranged between the lower core (or shield) 11$b$ and a shield 16.

Figure 6:
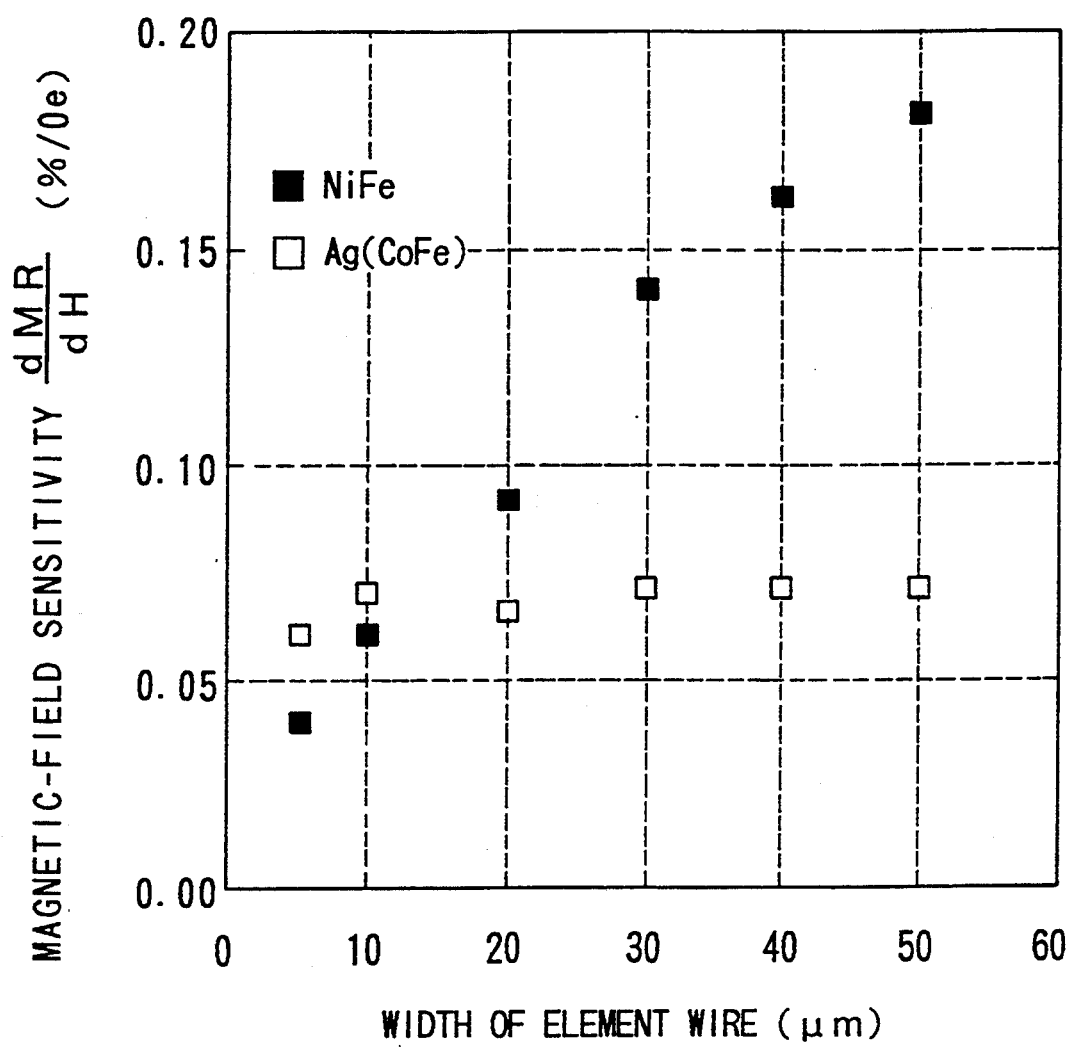
FIG. 6 is a graph showing a relationship between the magnetic-field sensitivity and the width of wire of the MR component used as a part of the magnetic head.
Figure 7:
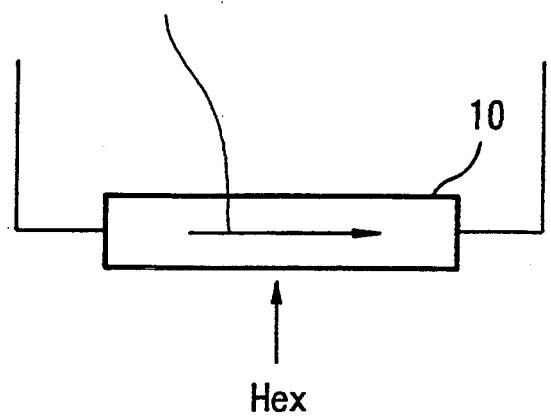
FIGS. 7A and 7B are drawings which are used to explain properties of the magnetoresistive material which is placed in the external magnetic field.
Figure 7:
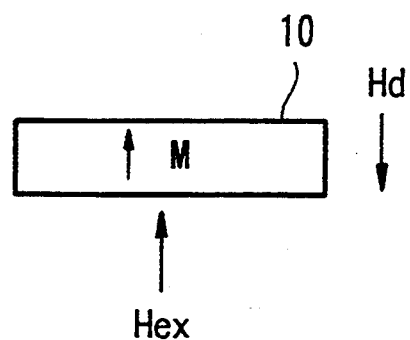

For the experiments, we have provided two kinds of MR components, one of which is formed by Nt—Fe alloy of ($Ni_{0.81}Fe_{0.19}$), and another is formed by a granular-type material of $(Co_{0.5}Fe_{0.5})_{0.28}Ag_{0.72}$. By changing the width of wire of the MR component using the photo-etching technique, the we have studied the variation of the magnetic-field sensitivity in accordance with the method as shown by FIG. 3. Results of the experiments are shown by FIG. 6 and Table 4. Incidentally, the unit of "%/Oe" is used for the numbers, representing the magnetic-field sensitivity, described in Table 4.

FIG. 6 and Table 4 obviously show that if the width of element wire is less than 10 μm, the magnetoresistive material according to the present invention is advantageous in the magnetic-field sensitivity as compared to the conventional magnetoresistive material which is made by the Ni—Fe alloy.

Lastly, this invention may be practiced or embodied in still other ways without departing from the spirit or essential character thereof as described heretofore. Therefore, the preferred embodiment described herein is illustrative and not restrictive, the scope of the invention being indicated by the appended claims and all variations which come within the meaning of the claims are intended to be embraced therein.

What is claimed is:

1. A magnetoresistive material composed of an alloy whose atomic composition is expressed by a following chemical formula:

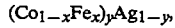
$(Co_{1-x}Fe_x)_y Ag_{1-y}$, where a value of x is set in a range of $0.45 \leq x \leq 0.55$, while a value of y is set in a range of $0.24 \leq y \leq 0.35$.

2. A magnetoresistive material according to claim 1 wherein a magnetic-field sensitivity of the magnetoresistive material is greater than or equal to 0.05 %/Oe.

3. A magnetoresistive material composed of an alloy whose atomic composition is expressed by a following chemical formula:

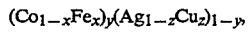
$(Co_{1-x}Fe_x)_y (Ag_{1-z}Cu_z)_{1-y}$, where a value of x is set in a range of $0.45 \leq x \leq 0.55$; a value of y is set in a range of $0.24 \leq y \leq 0.35$; and a value of z is set in a range of $z \leq 0.14$.

4. A magnetoresistive material according to claim 3 wherein a magnetic-field sensitivity of the magnetoresistive material is greater than or equal to 0.05 %/Oe.

* * * * *